(12) United States Patent
Matsuge

(10) Patent No.: US 6,504,430 B2
(45) Date of Patent: Jan. 7, 2003

(54) FEEDFORWARD TYPE LINEARIZER

(75) Inventor: Kazuhisa Matsuge, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/955,119

(22) Filed: Sep. 19, 2001

(65) Prior Publication Data

US 2002/0039048 A1 Apr. 4, 2002

(30) Foreign Application Priority Data

Sep. 26, 2000 (JP) .................................... 2000-291901

(51) Int. Cl.$^7$ ............................. H03F 3/66; H03F 1/26
(52) U.S. Cl. ..................................... 330/151; 330/149
(58) Field of Search ........................... 330/52, 149, 151

(56) References Cited

U.S. PATENT DOCUMENTS

| | | | | |
|---|---|---|---|---|
| 5,986,499 A | * | 11/1999 | Myer | 330/151 |
| 6,157,254 A | * | 12/2000 | Myer | 330/151 |
| 6,169,450 B1 | * | 1/2001 | Gentzler | 330/151 |
| 6,259,319 B1 | * | 7/2001 | Ghanadan et al. | 330/151 |

FOREIGN PATENT DOCUMENTS

JP 7-283658 10/1995

* cited by examiner

Primary Examiner—Robert Pascal
Assistant Examiner—Khanh Van Nguyen
(74) Attorney, Agent, or Firm—Oblon, Spivak, McClelland, Maier & Neustadt, P.C.

(57) ABSTRACT

There is disclosed a linearizer in which a main signal inputted to a main amplifier is orthogonally modulated by an orthogonal modulator to allow an upper side band signal or a lower side band signal to appear, the signal is used to perform a distortion compensation control, and a constitution of a side band signal detector is thereby simplified. When a phase of a base band signal from a modulated signal generator is reversed in time division, an appearance position of the side band signal is changed to a lower side from an upper side, or to an upper side from a lower side. Moreover, when the phase of the base band signal is changed at high speed, an amplification property is controlled at high speed.

3 Claims, 3 Drawing Sheets

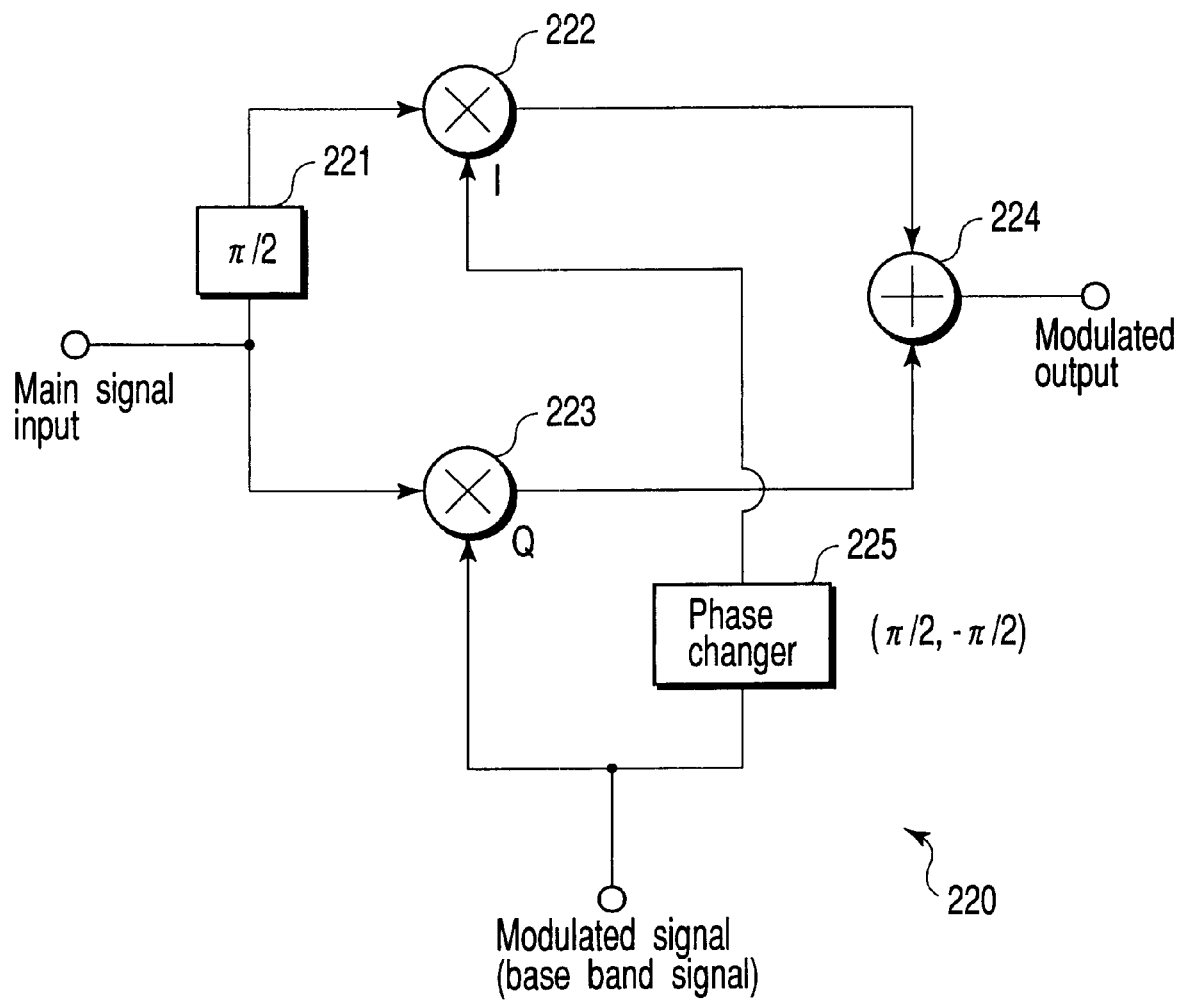
F I G. 2

FEEDFORWARD TYPE LINEARIZER

CROSS-REFERENCE TO RELATED APPLICATIONS

This application is based upon and claims the benefit of priority from the prior Japanese Patent Application No. 2000-291901, filed Sep. 26, 2000, the entire contents of which are incorporated herein by reference.

BACKGROUND OF THE INVENTION

1. Field of the Invention

The present invention relates to a feedforward type linearizer. The linearizer is an apparatus (circuit) that improve linearity of an amplifier. The present invention relates to a linearizer classified as a feedforward type.

2. Description of the Related Art

A feedforward type linearizer generates a signal whose phase is reverse to that of a distortion component included in an output signal of an amplification element and whose strength is equal to that of the distortion component, combines the signal with the output signal of the amplification element, and canceling the distortion component.

It is necessary to detect the distortion component for controlling this type of a linearizer with precision. However, a frequency of the distortion component fluctuates with the frequency of a carrier signal to be amplified. It is therefore difficult to steadily detect the distortion component. To solve the problem, this type of linearizer is constituted to mix a pseudo distortion component with the carrier signal before being inputted to the amplification element, detect the pseudo distortion component from the output signal of the amplification element, and thereby detect an inherent distortion component.

There is a feedforward type linearizer which uses a pilot signal as the pseudo distortion component. However, when the carrier signal belongs to a high frequency band, the necessity of generating a high-frequency pilot signal occurs. A pilot signal generator for a high frequency band has a complicated constitution and is expensive. Therefore, the use of the generator is avoided wherever possible.

An invention in which the distortion of an amplification signal can be compensated for without using a signal generator for the high frequency band is disclosed in Jpn. Pat. Appln. No. 6-066834 (filed in Japan). A distortion compensator disclosed in the publication modulates the carrier signal to be inputted to the amplification element with a modulated signal, generates a side band signal, and uses the side band signal as the pseudo distortion component. A signal belonging to a base band can be used as the modulated signal. Therefore, it is possible to generate the pseudo distortion component without using the signal generator for the high frequency band.

When the carrier signal is modulated with the modulated signal, an upper side band signal is generated on a high-frequency side of a band of the carrier signal, and a lower side band signal is generated on a low-frequency side. When the band of the carrier signal is narrow, either the upper side band signal or the lower side band signal is detected, and the distortion component of the carrier signal can effectively be suppressed.

Additionally, with the spread of modulation systems such as code division multiple access (CDMA), there has been a tendency to broaden the band of the signal inputted as the carrier signal, in recent years. In order to effectively suppress the distortion component of a broad band signal, both the upper side band signal and the lower side band signal need to be detected.

A conventional feedforward type linearizer comprises a band-pass filter for passing the upper side band signal, and a band-pass filter for passing the lower side band signal. Moreover, each filter is connected to a side band detector, so that the upper side band signal and lower side band signal are individually detected.

However, in this constitution, two systems are necessary for each of the band-pass filter and side band detector. Therefore, there is a disadvantage that the size and cost of the apparatus is increased.

To eliminate the disadvantage, there is a feedforward type linearizer for changing the frequency of the local signal. According to the constitution, one band-pass filter and one side band detector may be disposed.

However, in this constitution, a predetermined time is required until the frequency of the changed local signal is stabilized. Concretely, a lockup time of a local oscillator for generating the modulated signal, and a time for supplying a frequency changeover control signal are necessary. Therefore, the time required for detecting one side band is lengthened, which is disadvantageous as this makes it difficult to control the amplification properties at high speed.

In a CDMA communication system, when the number of multiple CDMA signals changes, the level of the transmission signal changes at high speed. Therefore, the amplification properties of the feedforward type linearizer applied to a transmitter of the CDMA signal need to be controllable at high speed.

BRIEF SUMMARY OF THE INVENTION

An object of the present invention is to provide a feedforward type linearizer whose amplification property can be controlled at a high speed without increasing a size and cost.

According to the present invention, there is provided a constitution comprising: a first power distributor for distributing an input signal to a main signal and an auxiliary signal; an orthogonal modulator for orthogonally modulating the main signal distributed by the first power distributor in response to a predetermined base band signal in order to generate a side band signal; a first vector adjuster for adjusting an amplitude and phase of the main signal modulated by the modulator; a first amplifier for amplifying the main signal; a second power distributor for distributing the main signal amplified by the first amplifier; a first power combiner for combining one signal distributed by the second power distributor and the auxiliary signal distributed by the first power distributor; a main signal detector for detecting the main signal from the signal whose power is combined by the first power combiner; a second vector adjuster for adjusting the amplitude and phase of the signal combined by the first power combiner; a second amplifier for amplifying the signal sent from the second vector adjuster; a second power combiner for combining the other signal distributed by the second power distributor and the signal amplified by the second amplifier; a side band signal detector for receiving an output signal from the second power combiner, and detecting the side band signal included in the output signal; a first controller, disposed between the main signal detector and the first vector adjuster, for controlling the first vector adjuster so that a value of the main signal detected by the main signal detector is minimized; and a second controller, disposed between the side band signal detector and the second vector adjuster, for controlling the second vector adjuster so that the value of the side band signal detected by the side band signal detector is minimized.

The orthogonal modulator comprises phase reverse means for generating I and Q signals for use in orthogonal modulation from the base band signal, and mutually reversing phases of the I and Q signals in time division.

The side band signal detector comprises: a local oscillator for generating a local signal of a frequency corresponding to a middle of a band of the input signal; a mixer for mixing the local signal from the local oscillator with the given output signal; one band-pass filter, connected to the mixer, for passing a frequency band in which the side band signal appears, a frequency band in which the side band signal appears with respect to the main signal, and a frequency band in a turning position; and a detector for detecting the side band signal from an output of the band-pass filter.

When these means are taken, the side band signal appears on either one of an upper side and a lower side with respect to the main signal in the output from the orthogonal modulator. Moreover, when the phases of the I and Q signals generated from the base band signal are mutually reversed by the phase reverse means, an appearance position of the side band signal alternately changes to the lower side from the upper side or to the upper side from the lower side. This depends on a principle property of an orthogonal modulation system.

When the side band signal detector detects the side band generated in this manner, a distortion compensation action can be realized in the feedforward type linearizer. However, in the present invention, the appearance position of the side band signal is changed by changing the phase of the base band signal. Therefore, a changeover speed can be raised, and it is therefore possible to raise a control speed. Moreover, since only one band-pass filter and one detector may be disposed in the side band signal detector, size and cost can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 2 is a diagram showing a constitution example of an orthogonal modulator 220 shown in FIG. 1.

DETAILED DESCRIPTION OF THE INVENTION

A preferred embodiment of the present invention will be described hereinafter in detail with reference to the drawings.

Figure 1:
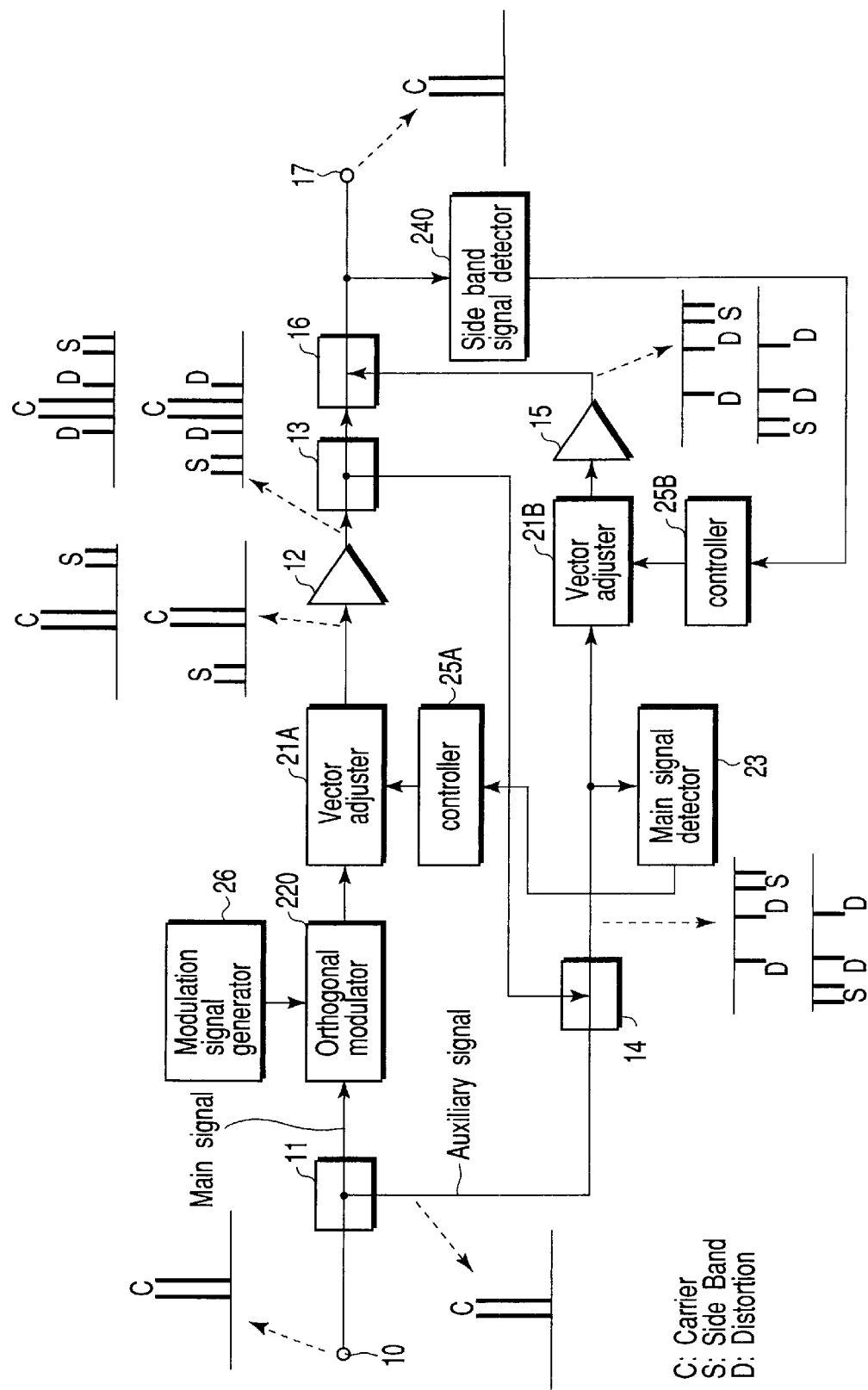
FIG. 1 is a circuit diagram showing a constitution of a feedforward type linearizer according to an embodiment of the present invention.

FIG. 1 is a circuit block diagram showing a constitution of a feedforward type linearizer according to the present embodiment. In FIG. 1, a high-frequency carrier signal (C: carrier) inputted to an input terminal 10 is branched into a main signal and auxiliary signal in a power distributor 11. The main signal is inputted to an orthogonal modulator 220, and orthogonally modulated in response to a modulation signal of a base band generated by a modulation signal generator 26. An output signal of the orthogonal modulator 220 is inputted to a vector adjuster 21A, and an amplitude and phase of the output signal are adjusted.

The output signal of the vector adjuster 21A is inputted to a main amplifier 12, and amplified. The output signal of the main amplifier 12 is outputted from an output terminal 17 via a power distributor 13 and power combiner 16.

The auxiliary signal is combined with a part of the output of the main amplifier 12 in a power combiner 14, and inputted to an auxiliary amplifier 15 via a vector adjuster 21B.

The power combiner 14 combines the auxiliary signal and the output of the main amplifier 12 in an opposite phase. A part of the output of the power combiner 14 is given to a main signal detector 23. A detection signal from the main signal detector 23 is given to a controller 25A. The controller 25A controls the vector adjuster 21A, and adjusts amplitude and phase of the main signal in order to minimize a carrier signal component included in the output of the power combiner 14. Thereby, a side band component (S: side band) generated by modulating the main signal, and a distortion component (D: distortion) by a property of the main amplifier 12 are outputted from the power combiner 14 in the opposite phase.

The output signal of the power combiner 14 is inputted to the power combiner 16 via the vector adjuster 21B and auxiliary amplifier 15. The power combiner 16 combines the output signal of the auxiliary amplifier 15 with the output signal of the main amplifier 12. A part of the output of the power combiner 16 is inputted to a side band signal detector 240. A detection signal from the side band signal detector 240 is given to a controller 25B.

The controller 25B controls the vector adjuster 21B, and adjusts the amplitude and phase of the auxiliary signal to minimize a side band component (S) included in the output of the power combiner 16. In the aforementioned constitution, the amplified carrier signal hardly including the distortion component can be obtained.

FIG. 2 is a diagram showing a constitution of the orthogonal modulator 220. In the orthogonal modulator 220, the main signal is branched to two systems. Moreover, the phase of one signal is shifted by 90° ($\pi/2$) by a phase shifter 221. This generates the main signals of the two systems which are different in the phase from each other by 90°($\pi/2$).

Similarly, a base band signal is branched into two, and the phase of one signal is shifted by ($\pi/2$) or ($-\pi/2$) by a phase changer 225. A signal passed through the phase changer 225 is referred to an I signal, and a signal not passed through the phase changer 225 is referred to as a Q signal. The I and Q signals are differ from each other in phase, by ($\pi/2$) or ($-\pi/2$).

The I signal is mixed with the main signal of one system in a mixer 222. The Q signal is mixed with the main signal of the other system in a mixer 223. Output signals of the mixers 222 and 223 are combined in an adder 224. Thereby, the orthogonally modulated main signal is outputted.

In FIG. 2, the phase changer 225 reverses the phase of the I signal in a time division manner. A phase relation between the I and Q signals is thereby reversed in time division.

Figure 3:
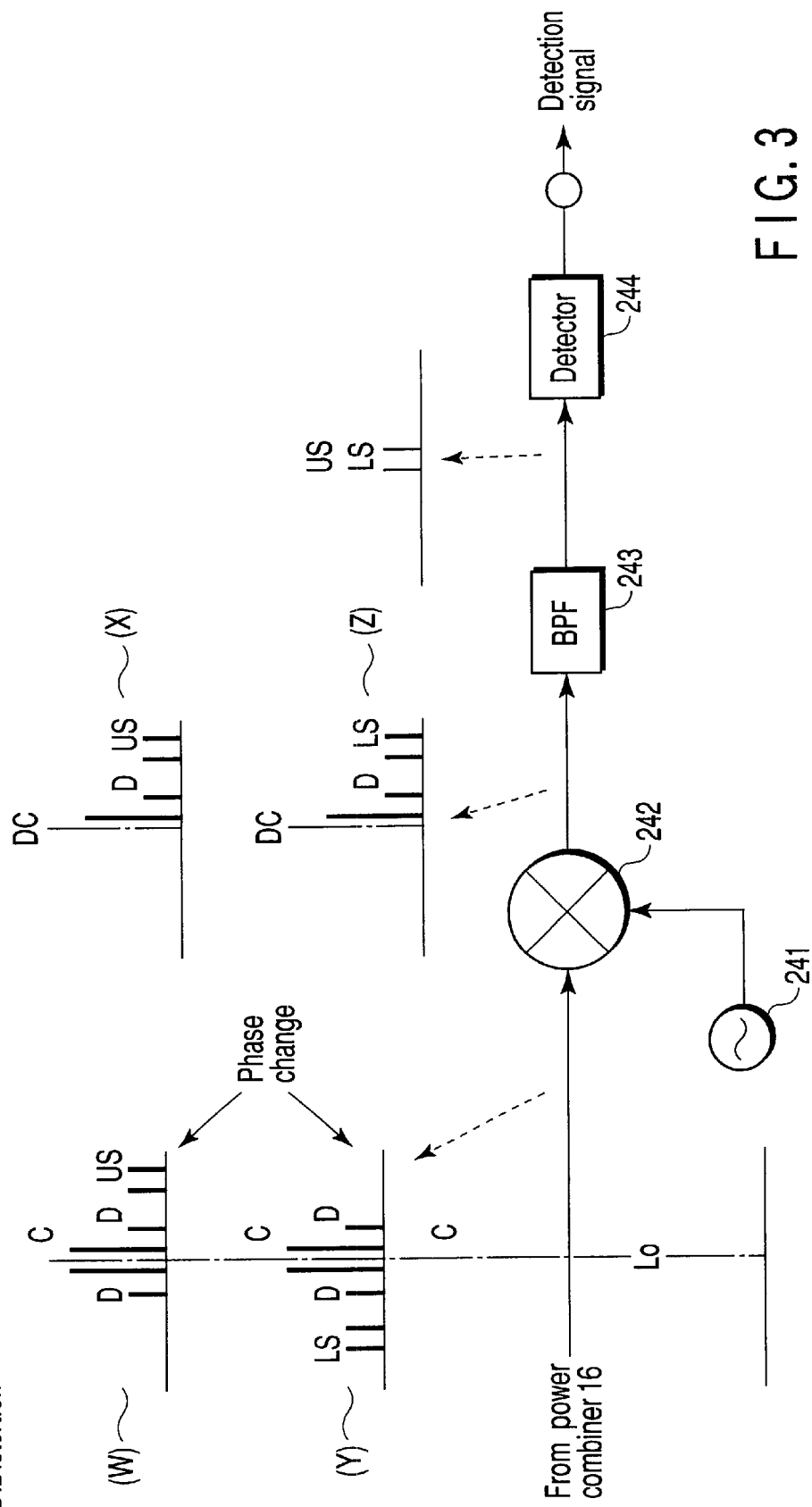
FIG. 3 is a circuit diagram showing a constitution of a side band signal detector 240 shown in FIG. 1.

FIG. 3 is a diagram showing a constitution of the side band signal detector 240. In FIG. 3, the output signal of the power combiner 16 is mixed with a local signal Lo generated by a local oscillator 241 in a mixer 242. Moreover, the output of the mixer 242 is inputted to a band-pass filter (BPF) 243, and either an upper side band signal US or a lower side band signal LS is inputted to a detector 244 in a time division manner. Furthermore, the upper side band signal US or the lower side band signal LS is detected in the detector 244.

In FIG. 3, a frequency of the local signal Lo is fixed to a value corresponding to a middle of a band of the carrier signal (C). Moreover, a pass band of the band-pass filter 243 is set to a band corresponding to the band turned the upper side band signal (US) or the lower side band signal (LS) or D.C.

An action in the aforementioned constitution will next be described. The aforementioned constitution is characterized in that the main signal is orthogonally modulated by the orthogonal modulator 220. In general, when the signal is orthogonally modulated, either the upper side band signal or the lower side band signal appears. This phenomenon is unique to an orthogonal modulation system.

In FIG. 1, it is assumed that a modulated signal having the upper side band signal (US) is outputted from the orthogonal modulator 220. Then, a signal having a waveform shown by (W) in FIG. 3 is given to the side band signal detector 240. When the signal is combined with the local signal Lo, as shown in (X) of FIG. 3, the signals US appear in symmetric positions with respect to Lo in an output waveform of the mixer 242. In this case, the upper side band signal (US) positioned on a high band side is detected in the detector 244.

It is assumed that the phase of the base band signal is changed from this state in the orthogonal modulator 220. Then, the orthogonal modulator 220 outputs the modulated signal which has the lower side band signal (LS). In this case, the signal with a waveform shown by (Y) of FIG. 3 is given to the side band signal detector 240. When the signal is combined with the local signal Lo, as shown in (Z) of FIG. 3, the signals LS appear in the turning positions with respect to D.C. in the output waveform of the mixer 242. In this case, the lower side band signal (LS) appearing on the high band side is detected by the detector 244.

When the local frequency Lo is set to the middle of the band of the carrier signal (C) in this manner, the side band signal appears in the symmetric position with respect to the carrier signal (C) on a frequency axis. Thereby, one band-pass filter 243 and one detector 244 can be used to detect both the upper and lower side band signals. Therefore, a distortion compensation control can be realized with a high precision and in a broad band.

Moreover, in the present embodiment, when the phase of the modulated signal is reversed, the appearance position of the side band signal is changed. For example, when a signal path of a circuit having a phase shifter is switched by a semiconductor element, the phase of the modulated signal can be remarkably easily reversed at high speed. Therefore, a time required for detecting the upper and lower side band signals can be shortened, and the amplification property can be controlled at high speed.

As described above, in the present embodiment, the main signal inputted to the main amplifier 12 is orthogonally modulated by the orthogonal modulator 220 to allow the upper or lower side band signal to appear, and this signal is used to perform the distortion compensation control. Thereby, the constitution of the side band signal detector 240 is simplified. When the phase of the base band signal from the modulated signal generator is reversed in time division, the appearance position of the side band signal is changed to the lower side from the upper side or to the upper side from the lower side. Moreover, when the phase of the base band signal is changed at high speed, the amplification property is controlled at high speed.

That is, when the upper or lower side band signal is used to perform the distortion compensation control, the constitution of the side band signal detector 240 can be simplified. Therefore, the size and cost of the apparatus can be reduced. Moreover, when the phase of the base band signal is reversed at high speed, the appearance position of the side band signal can be changed at high speed. Thereby, the amplification property can be controlled at high speed.

Additionally, the present invention is not limited to the aforementioned embodiment. The constitution of the orthogonal modulator 220 is not limited to that of FIG. 2. For example, the orthogonal modulator 220 can be constituted of a varactor diode, PIN diode, and the like. This can further simplify the constitution.

Moreover, in the present embodiment, the phase changer 225 changes the phase of the modulated signal by a unit of $\pi/2$ or $-\pi/2$. This is not limited, and the phase may be changed by a unit of 0 or $\pi$. Furthermore, in FIG. 2, only the phase of the I signal is changed, but both phases of I and Q signals may be changed. That is, the phases of the I and Q signals may alternately be reversed.

Additionally, the present invention can variously be modified/implemented without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A feedforward type linearizer comprising:
   a first power distributor for distributing an input signal to a main signal and an auxiliary signal;
   an orthogonal modulator for orthogonally modulating the main signal distributed by said first power distributor in response to a predetermined base band signal in order to generate a side band signal;
   a first vector adjuster for adjusting an amplitude and a phase of the main signal modulated by the orthogonal modulator;
   a first amplifier for amplifying the main signal;
   a second power distributor for distributing the main signal amplified by the first amplifier;
   a first power combiner for combining one signal distributed by the second power distributor and the auxiliary signal distributed by said first power distributor;
   a main signal detector for detecting the signal output from the first power combiner;
   a second vector adjuster for adjusting the amplitude and the phase of the signal combined by said first power combiner;
   a second amplifier for amplifying the signal sent from the second vector adjuster;
   a second power combiner for combining an other signal distributed by said second power distributor and the signal amplified by said second amplifier;

a side band signal detector for receiving an output signal from the second power combiner, and detecting the side band signal included in the output signal;

a first controller, disposed between said main signal detector and said first vector adjuster, for controlling said first vector adjuster so that a value of the main signal detected by said main signal detector is minimized; and a second controller, disposed between said side band signal detector and said second vector adjuster, for controlling the second vector adjuster so that the value of the side band signal detected by said side band signal detector is minimized.

2. The feedforward type linearizer according to claim 1, wherein said orthogonal modulator comprises phase reverse means for generating an I signal and a Q signal for use in orthogonal modulation from said base band signal, and mutually reversing phases of the I signal and the Q signal in time division.

3. The feedforward type linearizer according to claim 1, wherein said side band signal detector comprises:

a local oscillator for generating a local signal of a frequency corresponding to a middle of a band of said input signal;

a mixer for mixing the local signal from the local oscillator with said given output signal;

a band-pass filter, connected to the mixer, for selectively passing any one of a frequency band in which said side band signal appears, a frequency band in which said side band signal appears with respect to said main signal, and a frequency band in a turning position; and a detector for detecting said side band signal from an output of the band-pass filter.

* * * * *